(12) United States Patent
Keller et al.

(10) Patent No.: US 9,404,969 B1
(45) Date of Patent: Aug. 2, 2016

(54) METHOD AND APPARATUS FOR EFFICIENT HIERARCHICAL CHIP TESTING AND DIAGNOSTICS WITH SUPPORT FOR PARTIALLY BAD DIES

(71) Applicants: Cadence Design Systems, Inc., San Jose, CA (US); International Business Machines Corporation, Armonk, NY (US)

(72) Inventors: Brion L. Keller, Binghamton, NY (US); Steven M. Douskey, Rochester, MN (US); Mary Kusko, Hopewell Junction, NY (US)

(73) Assignees: CADENCE DESIGN SYSTEMS, INC., San Jose, CA (US); INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/530,218

(22) Filed: Oct. 31, 2014

Related U.S. Application Data

(60) Provisional application No. 61/899,100, filed on Nov. 1, 2013.

(51) Int. Cl.
| | |
|---|---|
| *G01R 31/3177* | (2006.01) |
| *G01R 31/28* | (2006.01) |
| *G01R 31/317* | (2006.01) |
| *G06F 11/277* | (2006.01) |
| G01R 31/3185 | (2006.01) |
| G01R 31/3187 | (2006.01) |
| G06F 11/27 | (2006.01) |
| G06F 11/22 | (2006.01) |

(52) U.S. Cl.
CPC ........ *G01R 31/3177* (2013.01); *G01R 31/2815* (2013.01); *G01R 31/31703* (2013.01); *G06F 11/277* (2013.01); *G01R 31/3187* (2013.01); *G01R 31/318522* (2013.01); *G06F 11/22* (2013.01); *G06F 11/27* (2013.01)

(58) Field of Classification Search
CPC ..................... G01R 31/3177; G01R 31/31703; G01R 31/2815; G01R 31/3187; G01R 31/318522; G06F 11/277; G06F 11/22; G06F 11/27
USPC .......................................... 714/726, 732, 736
See application file for complete search history.

(56) References Cited

U.S. PATENT DOCUMENTS

| | | | | |
|---|---|---|---|---|
| 7,444,568 | B2 * | 10/2008 | Morrison | ....... G01R 31/318536 714/726 |
| 7,552,373 | B2 * | 6/2009 | Wang | ............... G01R 31/31926 714/724 |
| 2006/0200719 | A1 * | 9/2006 | Keller | ............ G01R 31/318547 714/732 |
| 2006/0282732 | A1 * | 12/2006 | Kiryu | ............. G01R 31/318547 714/738 |
| 2008/0016421 | A1 * | 1/2008 | McDevitt | ........... G01R 31/3187 714/733 |
| 2011/0179326 | A1 * | 7/2011 | Sharma | .................. G06F 11/277 714/728 |
| 2012/0084603 | A1 * | 4/2012 | Riley | ...................... G06F 11/27 714/30 |
| 2012/0159274 | A1 * | 6/2012 | Balakrishnan | ..... G01R 31/3187 714/732 |

OTHER PUBLICATIONS

Hamzaoglu et al., "Reducing Test Application Time for Full Scan Embedded Cores," Proc-, IEEE 29th Fault-Tolerant Computing Symposium, pp. 260-267, 1999.*

Dale Meehl, "Expanding Manufacturing Verification to the Real World with LBIST", 2014.

* cited by examiner

*Primary Examiner* — Cynthia Britt
(74) *Attorney, Agent, or Firm* — Sawyer Law Group, P.C.

(57) ABSTRACT

SOC and other chip designs increasingly feature IP cores, and many copies of the same core may be present in a single chip. Using wrapped cores, it is possible to determine which cores are defective on a chip during test. Multiple instances of identical cores may be tested in parallel to easily determine which cores are failing. The cores compare a signature generated during test of the core against an expected signature, having a pass/fail bit as a result. The pass/fail bits may be multiplexed at an output pin where output pins are at a premium relative to the number of core instances or the pass/fail bit stored in a register to be later serially-unloaded from the chip. The disclosed embodiments provide for masking circuitry, as well as both identical and different core instances to be run serially and in parallel.

18 Claims, 6 Drawing Sheets

METHOD AND APPARATUS FOR EFFICIENT HIERARCHICAL CHIP TESTING AND DIAGNOSTICS WITH SUPPORT FOR PARTIALLY BAD DIES

CROSS-REFERENCE TO RELATED APPLICATION

This application claims the benefit of Provisional Application No. 61/899,100, filed Nov. 1, 2013. Priority to this provisional application is expressly claimed, and the disclosure of the provisional application is hereby incorporated herein by reference in its entirety.

FIELD

The present patent document relates generally to electronic design automation. In particular, the present patent document relates to a method and apparatus for efficient hierarchical chip testing and diagnostics with support for partially bad dies.

BACKGROUND

Integrated circuit designs continue to increase in size and complexity, a bottom-up hierarchical design flow is becoming more common. In particular, system on a chip-type designs ("SOC") incorporating a number of intellectual property cores ("IP cores" or "cores") are increasingly common. SOCs are devices partially or wholly integrating various computer components into a monolithic semiconductor integrated circuit or a single package carrying several interconnected monolithic integrated circuits. "Chip" includes either configuration. An IP core is a reusable unit of logic, cell, or chip layout design that can be used as building blocks along with other logic to create a chip, including SOCs. Examples of IP cores include microprocessors such as those having ARM architectures, and peripheral controllers such as those for PCI Express, SDRAM, Ethernet, or USB devices. IP cores may be available as synthesizable register-transfer level ("RTL"), in a suitable hardware description language, or as gate-level logic in a netlisting language such as Verilog, or as physical layouts at a transistor level. IP cores are so named because a core is generally licensed from the vendor who is the party or entity that creates the IP core, and it is licensed by the circuit designer for use in the SOC.

In a bottom-up flow, the IP cores are separately designed and acquired, then integrated into an SOC. The IP core vendor can also create test patterns specific to a particular IP core, which can then be migrated for use in testing the SOC. The advantage of such an arrangement is that the test patterns are then portable along with the core, and may be used for any number of SOC designs incorporating that particular IP core. This simplifies test pattern generation for the SOC as a whole.

When a chip contains many instances of the same or identical core, it may be possible to produce a fully functional chip in which all instances of these identical cores are functional. It may also be possible to produce a less functional chip that has less than all instances of these cores working. Such a chip with only some working cores might sell for a lower cost than a fully functional chip, but that is much better than discarding chips that are mostly working and functional. Efficiently testing these chips, which may have a large amount of circuitry fabricated thereon, and efficiently identifying when a chip is fully good and functional, good enough to use with reduced function, or so bad and dysfunctional that it must be discarded, is a key challenge in the semiconductor industry.

SOCs may have instances of many different kinds of cores and more fundamentally, may have many instances of the same core. For example, processor cores, such as an ARM processor, might appear as four copies inside a cell phone SOC. Other SOC designs may have over one hundred instances of the same, identical core or IP block. To help improve the yield on these large SOC devices, the functional operation of the chip may be made to work in the presence of some number of non-functional cores when there are many instances of the same core. Those chips with fewer working cores may be sold for less money than those with the full complement of working cores. Alternatively, the system may only work with a certain number of cores, in which case as long as at least that many cores are functional, the chip may be said to be "fully working." For example, a chip may be designed to contain 136 instances of a particular core, but at most 128 of these core instances will be used. So, there are allowed to be up to eight bad core instances before the chip would have to be discarded. This helps improve yield and makes more profit for the producer of the chip. This way of dealing with yield by including spare circuitry has been commonly used in memory chips and cores for many years, and has been successful at increasing yields for memories in general. SOCs and other chips using logic functions, in addition to memories, may also use this type of yield improvement technique.

In another example, the Cell processor chip may be used in a game console. The Cell chip had eight floating-point processor cores, but the software was designed to only ever use seven of the processors, as long as a chip had at least seven working floating-point processor cores, the chip could still be used in that game console; Cell chips with eight fully functional floating-point processors could be used in the game console as well, but could also be sold for higher revenue to a user that required all eight good floating point processors. This would greatly improve yields and reduce the cost of making the Cell processor chip, resulting in higher profit.

An issue with the ever-larger chip designs of today and tomorrow (i.e., chips with more and more circuitry) is that there is likely to be a large number of cores, and many identical instances of the same cores. During manufacturing test, it becomes important to detect when a failure is from a core that is allowed to be bad, i.e. a partially bad core type, and keep track of which and how many of each type of cores are bad.

One way to tell which core is bad is for the chip to be designed such that the test responses for each core are provided at a dedicated chip output pin for each core. This would allow manufacturing test to determine which core is bad based on which chip output pin has seen a failure. A problem with this approach is that with the increase in numbers of cores per chip, there may be more core instances than chip pins available for observing those cores; as a consequence, it is more challenging to track which core has tested "bad" over the course of applying the tests to the chip's cores. One alternative approach is to not test all cores at the same time. Rather, one may test only as many cores at one time as there are chip pins available to monitor simultaneously the outputs for the tested cores. This approach may be used, but is inefficient for testing a large number of identical cores on each chip.

SUMMARY

A method and apparatus for efficient hierarchical chip testing and diagnostics with support for partially bad dies is disclosed.

An embodiment comprises a method of testing an integrated circuit having a plurality of logic gates fabricated thereon to determine whether defects are present, wherein the integrated circuit to be tested comprises a plurality of core instances, with each of the plurality of core instances comprising a plurality logic gates and a plurality of scan chains. The method comprises, for each core instance of the plurality of core instances, receiving a plurality of test stimulus values for the plurality of scan chains; receiving an expected response signature for each core instance; loading the plurality of test stimulus values into each of the plurality of core instances in parallel to produce a test response output for each of the plurality of core instances; capturing the test response output for each of the plurality of core instances into the plurality of scan chains of a corresponding one of the plurality of core instances; for each core instance, generating a test response signature from the plurality of test response outputs stored in the plurality of scan chains; comparing the test response signature against the expected response signature for each core instance; generating a plurality of pass/fail bits for the plurality of core instances structured to correspond each pass/fail bit of the plurality of pass/fail bits to a core instance of the plurality of core instances, wherein the plurality of pass/fail bits contain information about whether the test response signature matches the expected response signature for each core instance; and unloading the pass/fail bits from a pin of the integrated circuit.

Another embodiment comprises a computer-readable non-transitory storage medium having stored thereon a plurality of instructions. The plurality of instructions when executed by a computer, cause said computer to perform, for each core instance of the plurality of core instances, receiving a plurality of test stimulus values for the plurality of scan chains; receiving an expected response signature for each core instance; loading the plurality of test stimulus values into each of the plurality of core instances in parallel to produce a test response output for each of the plurality of core instances; capturing the test response output for each of the plurality of core instances into the plurality of scan chains of a corresponding one of the plurality of core instances; for each core instance, generating a test response signature from the plurality of test response outputs stored in the plurality of scan chains; comparing the test response signature against the expected response signature for each core instance; generating a plurality of pass/fail bits for the plurality of core instances structured to correspond each pass/fail bit of the plurality of pass/fail bits to a core instance of the plurality of core instances, wherein the plurality of pass/fail bits contain information about whether the test response signature matches the expected response signature for each core instance; and unloading the pass/fail bits from a pin of the integrated circuit.

According to another embodiment the plurality of pass/fail bits may be stored in a plurality of flag registers, wherein the stored pass/fail bits each produce a pass/fail signal.

According to another embodiment the expected response signature for each core instance and the test response signature for each core instance comprise composite signatures.

Another embodiment further comprises merging the composite signatures from the plurality of core instances to create a chip-level composite signature.

Another embodiment further comprises loading masking values for each core instance of the plurality of core instances, and masking the test response output for each of the plurality of core instances using the masking values.

Another embodiment further comprises broadcasting the expected response signature and masking values to a plurality of identical core instances; and loading the expected response signature and mask values into each of the identical core instances of the plurality of identical core instances.

Another embodiment further comprises concatenating serial load chains across a plurality of non-identical core instances to independently load expected response signatures and masking data, wherein the plurality of non-identical core instances are copies of base core instances of different core types to be tested in parallel.

In another embodiment, an integrated circuit comprises a plurality of core instances fabricated on the integrated circuit, each of the plurality of core instances having a scan input; scan test logic for each core instance of the plurality of core instances, fabricated on the integrated circuit and coupled to the core instance, wherein the scan test logic includes a plurality of logic gates and a plurality of scan chains configured to generate a test response output when the core instance is run with a plurality of test stimulus values; a test response signature register for each of the plurality of core instances to store a test response signature generated from the test response output; an expected response signature register for each of the plurality of core instances in communication with the scan input to store an expected test response signature; and a comparator in each of the plurality of core instances coupled to the test response signature register and the expected response signature register that compares the test response signature to the expected test response signature, and which outputs a pass/fail signal containing information about whether the test response signature matches the expected response signature for the core instance.

According to another embodiment the integrated circuit may further comprise a flag register for each of the plurality of core instances to set a pass/fail bit representative of the pass/fail signal.

According to another embodiment the integrated circuit may further comprise an output pin, and a multiplexer configured to select a pass/fail signal from one of the plurality of core instances to feed the pass/fail signal to the output pin through the multiplexer.

Another embodiment comprises the integrated circuit may further comprise a core pass/fail select bus coupled to the multiplexer to provide a set of core instance select signals to the multiplexer.

According to another embodiment the test response signature comprises a composite signature formed by compacting with XOR logic the test response signatures from a plurality of test response signature registers, and wherein the expected response signature comprises a composite signature formed by compacting with XOR logic the expected response signatures from a plurality of expected response signature registers.

According to another embodiment the integrated circuit may further comprise a masking circuit coupled to the scan test logic to mask the test response output of core scan chains according to a plurality of masking values.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
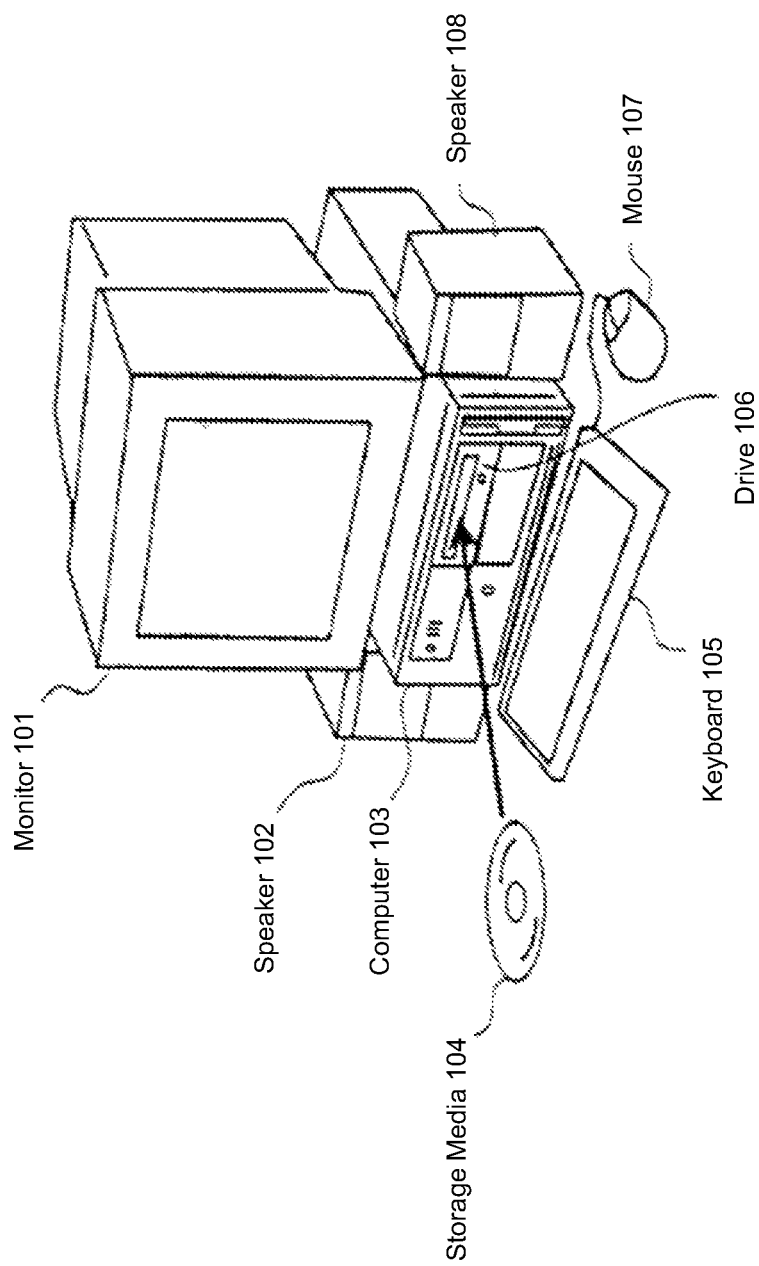
FIG. 1 illustrates an exemplary general-purpose computer system.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for efficient hierarchical chip testing and diagnostics with support for partially bad dies is disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 illustrates an exemplary general-purpose computer system, according to an embodiment. The computer system comprises a computer 103 configured to read storage media 104 at its drive 106. The computer system further includes a monitor 101 for the user to view visual output from the computer 103, and keyboard 105 and mouse 107 for the user to input data and commands to computer 103. Storage media 104, although illustrated as an optical disk for an optical drive 106 for ease of understanding in this illustration, may be any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions. The storage media or medium may be internal to the computer 103, or external and attachable through a communication interface. Drive 106 may be any drive suitable for reading storage media 104 or any interface suitable to couple storage media 104 to the bus of computer 103 when storage media 104 is read. The exemplary computer system can be programmed by a user according to the various disclosed embodiments to perform these methods. The computer system may be programmed by reading instructions stored in internal or external computer storage media 104.

Figure 2:
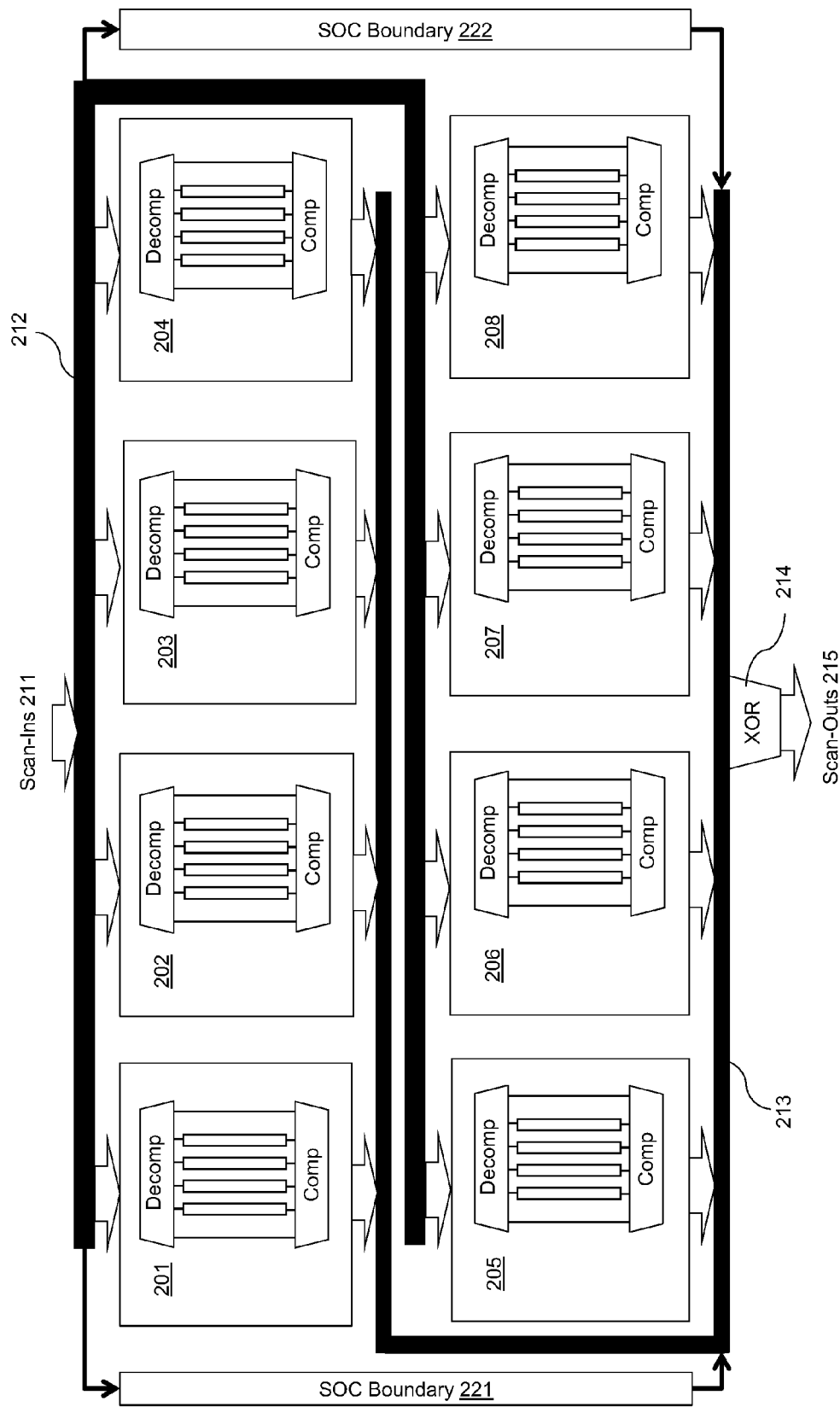
FIG. 2 is an illustration of a full design for test model for a hierarchical SOC design having a number of IP cores containing internal scan chains and test compression structures.

FIG. 2 illustrates a full design for test ("DFT") model for a hierarchical design according to an embodiment. This is a hierarchical test compression architecture that allows testing multiple core instances simultaneously while compressing their output expect values further to chip output pins. Here, the SOC has eight reusable IP cores 201 to 208, but there may be any number of IP cores in the SOC design, as well as additional logic outside of the IP cores themselves. Each of the IP cores can be different, or can include a number of instances of the same IP core. For example, IP core 202 may be a copy of IP core 201, and is another instance of the same logic. Each of the IP cores contains a number of scan chains, as well as compression ("comp") and decompression ("decomp") logic, to scan test the logic of the IP cores. Scan-Ins 211 originating from off of the SOC chip provide test patterns to each of the IP cores 201 to 208, as well as to the boundary logic of the SOC, SOC Boundary 221 and SOC Boundary 222, using a scan input bus 212. Scan-Ins 211 can be provided by external test equipment, such as automated test equipment ("ATE"), and generated at some prior time by test pattern generation software. The test patterns are applied to the IP cores 201 to 208, scanned through the respective scan chains of the IP cores, and the results compressed and output to a scan output bus 213. Also compressed and output are the test results from test patterns applied to the SOC boundary logic 221 and 222. The outputs are further compressed by compression logic XOR 214 and scan-outs 215 are scanned out of the SOC.

Using wrapped cores that isolate each core from other cores and from surrounding non-core logic, it is possible to test the internals of each core, and detect when specific core instances are defective. Ideally, manufacturing test wants to quickly determine if a tested chip is acceptable, or whether it should be discarded as defective. When the tested chip is acceptable, manufacturing test may further want to know which, if any, core instances in particular are defective within the chip. For example, certain fuses may be blown to keep the defective cores from interfering with or causing errors on the rest of the chip. Or, manufacturing may want to know in order to place the partially-operative chip into a certain bin for later packaging. In addition, it is normally the task of manufacturing test to recognize when too many of a specific kind of core are defective such that the chip should be discarded.

If each core instance is tested by itself in isolation, it would be simple to note which core instances are defective. However, this would be an inefficient use of test time and test resources. A more efficient approach is to test multiple core instances in parallel. However, current industry approach of using test compression logic merges test responses from all of the cores before presenting the responses at output pins of the chip. When a tested chip output shows a difference compared to an expected result, due to the merging together of many core outputs, it is difficult or impossible to determine which core or cores are responsible for the incorrect response or responses. At least one microprocessor core provider today currently requires that each core feed its own chip output pin or pins, so that the core provider can determine which cores are bad and causing failures, and to help diagnose where the failures are occurring. This approach allows quickly identifying which cores are defective, but it also requires one or more chip output pin for each core being tested at the same time. It is more efficient if more or even all cores can be tested at the same time when there are more cores than there are chip output pins available to observe the core output responses.

According to an embodiment, multiple instances of identical cores can be tested in parallel. The embodiment allows a quick and easy determination of which cores are failing when chip output responses are not as expected. Each core instance in parallel can compare its response to a set of expected responses, and raise a fail flag when a mismatch is detected. By producing a pass/fail signal for each core instance, it is possible to send these signals out to their own chip output pins. Bits representative of such pass/fail signals may be held in one or more fail flag registers. Manufacturing can then tell based on which chip output pin is failing, which core instance is failing. Multiple pins may also be used, and multiple core pass/fail signals sent out to chip output pins, where failures may be detected on multiple pins at the same time. When there are more core instances than there are chip output pins available to observe the pass/fail signals, core pass/fail signals presented at the chip output pins may be multiplexed. For multiplexed output pins, one or more chip input pins may be used to select which subset of core instances are to be observed at any given time on the chip output pins.

According to another embodiment, the pass/fail bits may be captured into "sticky" fail bit flip-flops. There can be one fail bit flip-flop per core instance. The flip-flop bits can then be serially unloaded from the chip when core testing is complete, and it is noted which serially unloaded bits correlate to which core instances, and registering if any test failed or if all tests passed.

By using such an approach it is possible to test multiple core instances in parallel for high efficiency, yet still be able to tell if the chip fails during test, and which core instances are responsible for the test mismatches. Using this information, manufacturing test can track over multiple tests the core instances that have failed one or more tests and decide whether the chip is good enough to be used or must be discarded. Also, when manufacturing is interested in diagnosing where the failures are located, knowing which core instances have failed allows the use of merged compression outputs from all cores since only a failing core instance can contribute to the merged response failures. This allows diagnostic software to more easily determine which core instance has failed, and where within that core instance the defect is likely located. Without such pass/fail data indicating which core or core instance was failing, merged compression results would make it more difficult, if not impossible to determine which of the core instances was responsible for fails in the merged test responses. This approach also avoids the potential situation wherein the responses of multiple failing core instances cancel out within the merged response data in such a way that the failing chips might incorrectly be seen as passing. Here, even if the merged responses cancel out failures from an even number of identical cores, the core instance pass/fail results would still catch the failures.

One advantageous way to gain test efficiency is to apply tests to the chip that will simultaneously test all instances of the same core or cores. If the stimulus for each core is broadcast from chip scan-in pins to all of the cores' scan-in pins identically, then when a test is loaded into one core instance, all identical instances will have loaded the same stimulus values and will essentially apply the same test to all instances. This way may be applied for example to the full design for test model illustrated in FIG. 2.

The response data values within each core can be a huge amount of values kept within each state element of the core. Normally these state elements are placed into a scan chain for ease of loading new test stimulus values and for unloading test response values. Test compression logic within the core can be used to reduce the volume of data loaded into each core and also reduce the amount of data having to be unloaded from each core. Signature analysis can effectively reduce the response data volume, for example, logic built-in-self-test ("LBIST") or test compression that feeds all internal scan chain outputs into one or more signature registers. This compresses all response values down into a small set of signatures for each signature register. The final states of all these signature registers may be further compressed by XORing the final signatures of each register together to create a composite signature that can then be observed. Such composite signatures may be at least 16 bits wide to make aliasing issues less likely and a composite signature may even be 32 or more bits wide.

Figure 3:
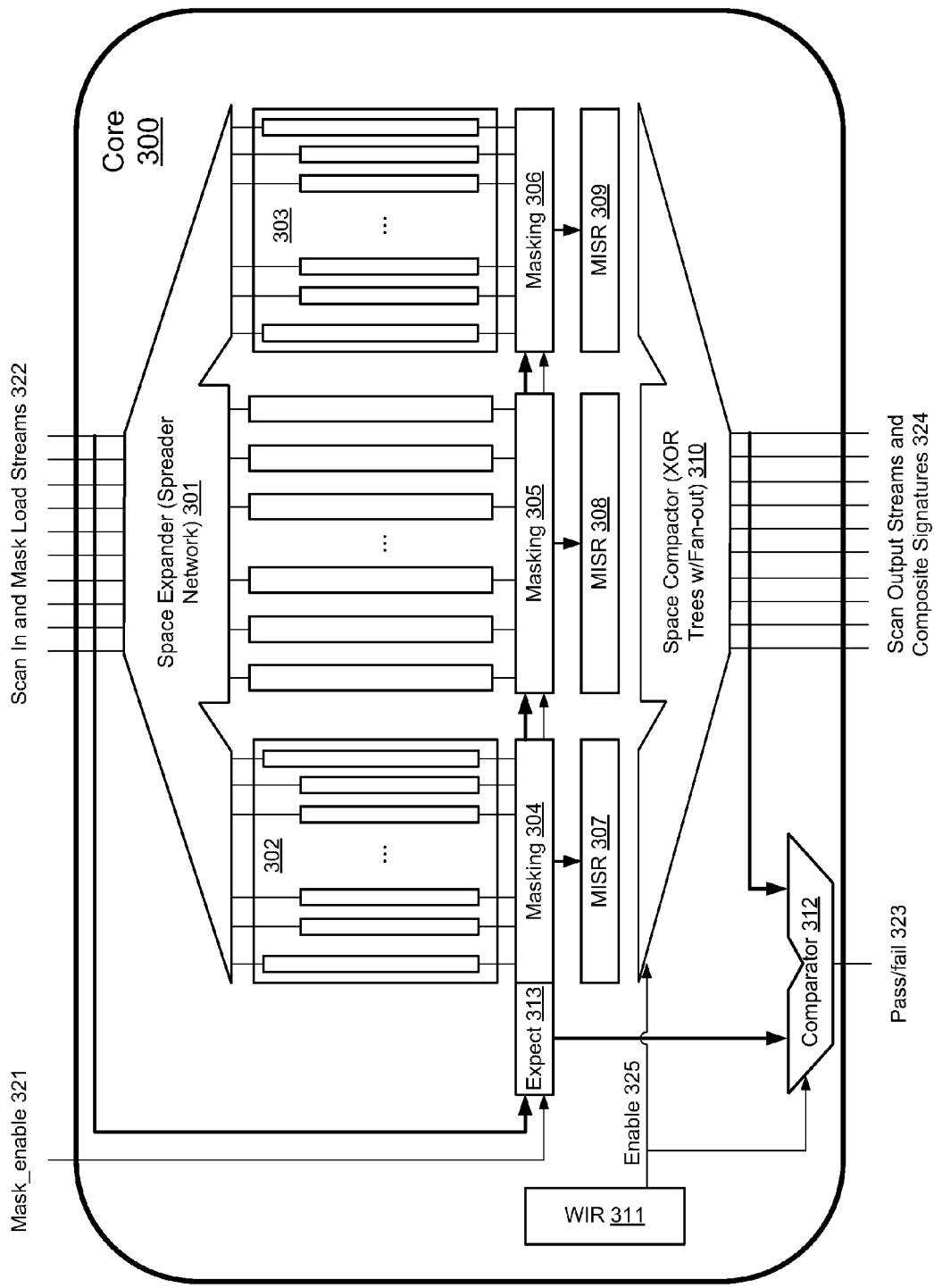
FIG. 3 is an illustration of a core for internal composite multiple input signature register (MISR) signature compare.

FIG. 3 illustrates a core 300 for internal composite multiple input signature register ("MISR") signature compare according to an embodiment. Using the core 300, the responses to the various applied tests may be observed separately for each core in a chip having multiple cores, such that it can be determined which cores are passing and which cores are failing each test. Signatures may be collected from each core, an expected signature fed into each core, and the core internally compares the expected and actual signature to produce a pass/fail signal from the core. Now, at the expense of having to load into each core what the expected composite signature should be, a single signal is produced from each core instance to clearly denote passing or failing status for each core instance on each test. This allows a single chip pin to be used to observe the pass/fail signal for a core instance, allowing more cores to be tested simultaneously for a given set of chip pins for observing core outputs.

In the embodiment illustrated in FIG. 3 scan in and mask load streams 322 are received into the core 300, and distributed to the spreader network 301 for scan ins, and to expect registers 313 and Masking registers (inside 304, 305 and 306) for the mask load. The spreader network 301 distributes the scan in values to the various scan chains of the core, including scan chains 302 and 303, the output of the scan chains received by masking circuits 304, 305, and 306. Expect 313 may be a set of bits, for example 16-bit or 32-bit registers, to store the expected composite signature values, which are included as part of the scan in and mask load stream 322. Also included in the scan in and mask load stream 322 are the mask values for masking circuits 304, 305, and 306. Once masked, the test response values are stored in the multiple input signature registers (MISR) 307, 308 and 309. A space compactor 310, which may be XOR trees having fan out, may then be used to generate outputs 324, including scan output streams and/or composite signature values. The composite signature values may then be compared with the expected signature values stored in expect registers 313 using comparator 312. Comparator 312 then outputs a pass/fail signal 323 indicating whether the actual composite signature matches the expected signature values.

Masking is enabled by mask_enable 321 signal(s) that originates from off-core and it is handled similar to the scan in data. Wrapper instruction register ("WIR") 311 is an instruction register that may be programmed ahead of time to provide enable signals to space compactor 310 and comparator 312. WIR 311 may be provided in accordance with the IEEE 1500 architecture standard for wrapped cores. Likewise, the core instances disclosed herein may be wrapped according the IEEE 1500 standard, but need not be.

According to another embodiment, the expected signature values may be loaded independently of masking circuits 304, 305, and 306, rather than loaded along with the masking values as illustrated in FIG. 3.

In another embodiment, there may be more core instances than there are chip output pins with which to observe them. For example, a designer may have more than 100 core instances, and would therefore not be likely to be able to observe all core pass/fail signals at the same time with a limited number of chip pins. The core instances may be partitioned into subsets that will be observed in parallel. With partitioning, the core instances may be tested in parallel, but observation of their unique pass/fail signals can be time-multiplexed onto the same set of chip output pins.

Figure 4:
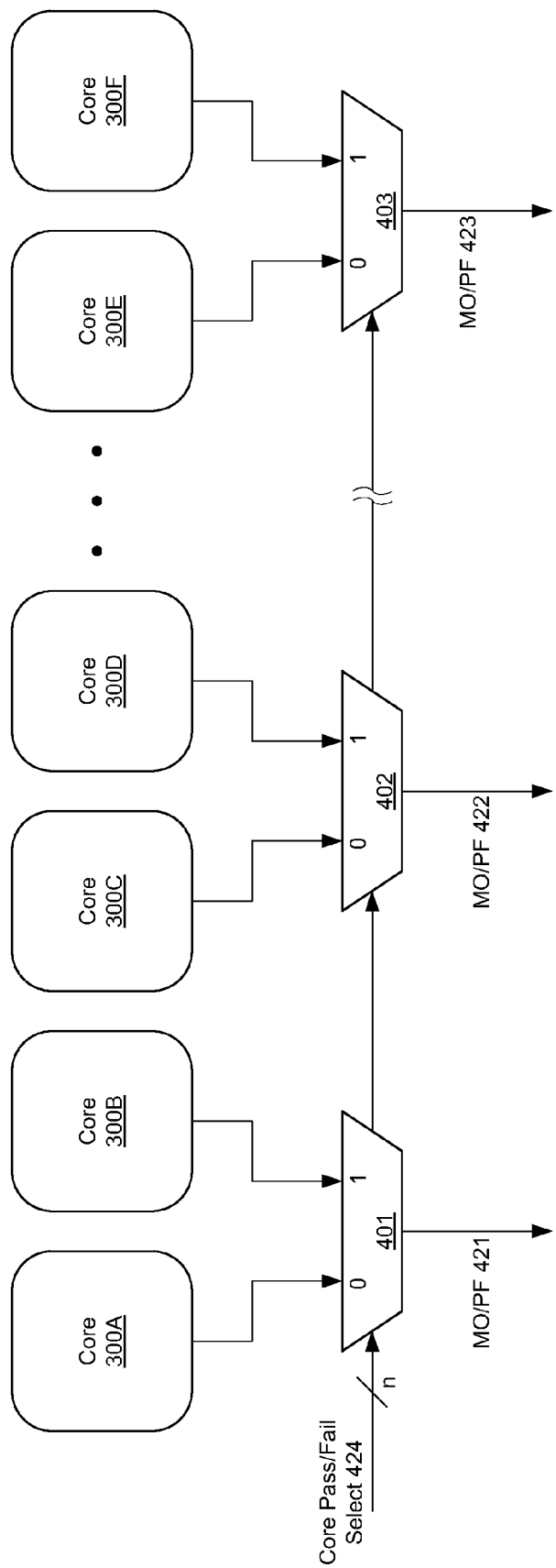
FIG. 4 is an illustration of an apparatus decoding select signals from chip pins to observe multiple sets of IP core instances. Multiplexors 401, 402 and 403 are able to select for observation at chip pins a subset of core pass/fail signals.

FIG. 4 illustrates a mechanism to use chip pins to select which set of core pass/fail signals are visible on chip pass/fail ("PF") pins, allowing the observation of multiple sets of core instances by decoding select signals from chip pins. The core pass/fail signal is multiplexed out to a chip pin so that it is possible to know which cores are failing by checking the state of a set of chip pass/fail signals at the appropriate time. A decoded, core pass/fail select bus 424 can be fed from chip scan-in pins at the time of pass/fail observations. The core instances' pass/fail signals become available on chip output pins after each test by cycling through all valid states of the "core pass-fail select" pins receiving core pass/fail select signals. Cores 300A and 300B provide pass-fail signals to multiplexer (mux) 401, cores 300C and 300D provide pass-fail signals to mux 402, and cores 300E and 300F provide pass-fail signals to mux 403, respectively. The output of muxes 401, 402, and 403 are signals MO/PF 421, MO/PF 422, and MO/PF 423 respectively. In FIG. 4, six cores 300 (300A, 300B, 300C, 300D, 300E, and 300F are shown), but a set of n chip pins for core pass/fail select allow up to $2^n$ different subsets of cores 300 to be checked using one tester cycle to switch between core subsets to observe. The cores 300 may be all tested in parallel, and the core pass/fail signals to observe may be switched after the test is done to observe the result. When a test is done being unloaded, the chip's pins may also be used for composite MISR observe ("MO") when they are not looking for core pass/fails. These same pins can also be used to observe the compressed scan chain values during the chain unloading on each shift cycle; they can be switched to observe the composite MISR signature (MO) or core pass/fail after the scan unload is completed.

Thus, according to an embodiment, if there are 128 core instances to be tested and only 32 chip output pins available to observe them, all 128 core instances may be tested simultaneously and then after each test is applied, a set of 2 chip input pins is used to encode which of 4 subsets of 32 core instances will be observed at any one time, with the selection switching through all 4 sets very quickly (it takes approximately one tester cycle to switch between sets of core instances to be observed) after each test has been applied to the chip.

According to another embodiment, the pass/fail may be checked after all tests have been applied using a sticky bit to hold the pass/fail result bit until they are later unloaded from the chip serially according to a structure that correlates the pass/fail bit within a serial unload chain with a particular core instance.

The use of internal composite MISR signature comparison it is also very useful for diagnostics even in the situation where all core instances are required to be good, i.e. pass. If the pass/fail signals indicate only one core 300 instance is bad (e.g. 203), the composite, compressed chip output information from all cores being tested simultaneously can be used to diagnose within the bad core where the defect is most likely located. When multiple core instances show up as bad, the composite response data at the chip output pins may be very difficult to use directly as it is unclear which core is responsible for which error responses in the composite compressed results. Nonetheless, it is still possible to run diagnostics on the failing cores with only slightly degraded results. If more accurate results are necessary, the chip may be re-tested with only one core targeted at a time to collect the failure data for just the core instances known to be failing, one at a time and isolated. Since not all failing chips need to be diagnosed, it is generally possible to select chips that fail with only a single bad core for diagnostics. If multiple cores tested together fail, additional effort would likely be needed.

Note that while the above discusses testing multiple instances of the same or identical cores, it is also possible to use the embodiments disclosed herein to test multiple instances of several different cores. Their compressed output data may be combined at the chip level, and produce their own pass/fail signals viewed at chip output pins. When testing simultaneously only core instances that are identical to each other, the expected signatures of the core instances can be broadcast to all participating core instances because all core instances should produce identical signatures. However, when simultaneously testing instances of different cores, each unique core type being tested at the same time must load its own unique expected signature. This may be accomplished by concatenating the serial load registers containing the expect values in each core type so that the values loaded into each core type can be independent of the other core types. Since the mask load values for different core types will tend to be independently loaded for each type of core, placing the expect values in those same registers is a reasonable thing to do, although they may be loaded separately from mask register data without any concern.

Figure 5:
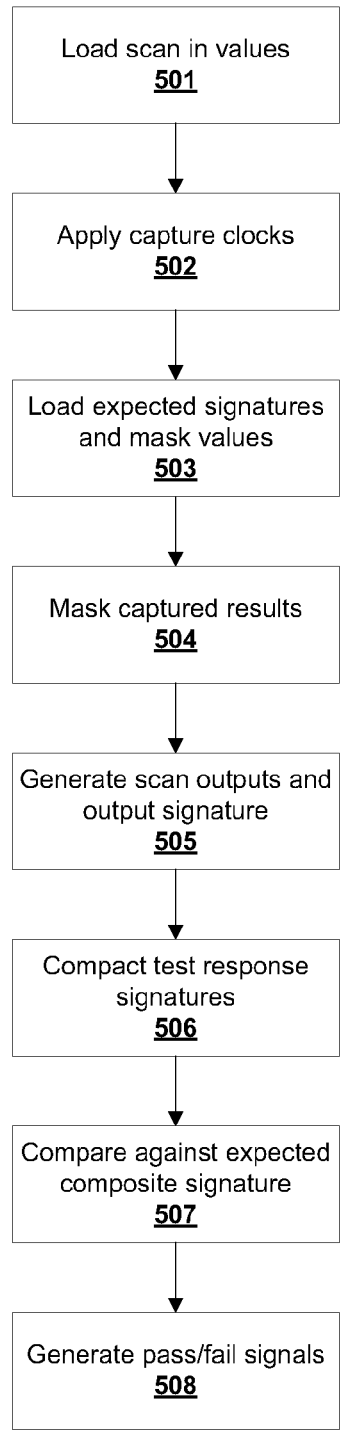
FIG. 5 illustrates a flow for testing an integrated circuit (chip) core instance according to an embodiment.

FIG. 5 illustrates a flow for applying a single test to an integrated circuit (chip) core instance according to an embodiment. Prior to step 501, the WIR will have been programmed to establish the correct state for isolating and testing the core with compression. At step 501, the scan in values are loaded into the internal scan chains after going through the decompressor. At step 502, capture clocks are applied to the circuit to capture the response of the circuit to the test stimuli loaded in the prior step. At step 503, the expected signature values and mask values are loaded into registers, awaiting the test output values to be received from the scan chains of the core instance. If no masking is needed for this test, only the expected signature values need to be loaded. At step 504, the results captured from step 502 can be unloaded and optionally masked by asserting the mask-enable on the appropriate shift cycles and using the mask register values loaded during step 503. If masking is not desired in the core instance, the mask_enable signal will not be asserted. Alternatively, if a core never requires masking, the masking circuitry may be omitted entirely from the core. The scan output streams are generated during step 505 and they can be captured into the MISRs 304 and optionally also around the MISRs to the scan outputs 324. At step 506 when the scan out operation is complete, the output test response signatures from all MISRs are compacted further and, at step 507, are compared against the expected composite response signature previously stored and made available to the comparator. At step 508, if the signatures match, a pass signal may be generated. If the signatures do not match, a failure is detected and a fail signal generated. The output pass/fail signal may be stored in a pass/fail register to be transmitted off chip at an output pin as desired. Where multiple core instances are being tested in parallel, these steps 501-508 may operate in parallel across various cores of the chip.

Figure 6:
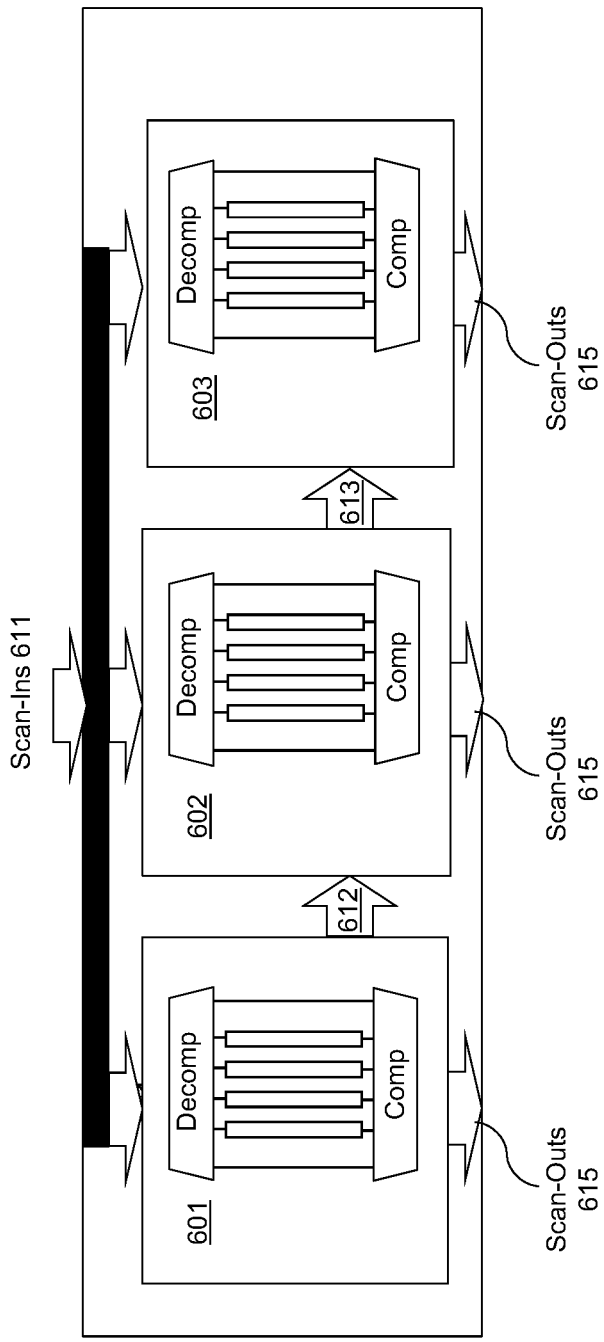
FIG. 6 illustrates a composite core model for generating tests to target multiple instances of different cores.

Experimental results from processing a single chip design with three different core types illustrate some of the benefits of the disclosed embodiments. FIG. 6 illustrates a composite core model for generating tests to target multiple instances of different cores. Each of cores 601, 602, and 603 are of different types, and an actual chip may contain multiple copies of each core. For example, an actual chip may contain ten cores 601, eight cores 602 and three cores 603. The mask load scan path for cores 601, 602, and 603 may be concatenated as illustrated by 612 and 613. In this case, the mask data is broadcast to cores 601 with cores 602 having their mask load registers concatenated to the output from core 601. Cores 603 may then receive mask data from the mask chain output of cores 602 as illustrated by 613. Pattern counts for three different cores 601, 602, and 603 were tested serially, i.e. one at a time, and then tested in parallel to compare the results. The generated patterns would test multiple instances of each core type. The cores in the tested designs all contained about 100K flops in their scan chains. There were nine scan-ins on each core and nine scan-ins on the chip that are broadcast to all three cores. Using a composite core model according to the embodiment illustrated in FIG. 6, tests were generated for all three core types in parallel and compared to a serial test application of each core type, one at a time. Testing all three cores serially produced a pattern count of approximately 53,000. Using the composite model, the pattern count was reduced to approximately 25,000, improving the efficiency at the chip level for testing the cores by over 50% reduction in pattern count.

The cores have internal test compression that is 100× the number of internal chains for scan-in pins. With masking implemented, one of the nine scan-in pins for the chip and cores is reserved for use as a mask-enable on each shift cycle, so it appears to ATE as a scan-data pin. Thus, if there were ten instances of a first core in the chip and they are all tested simultaneously by the same tests that target one instance, the 100× compression effectively becomes 1000× compression. Similarly, if there are ten instances of each of three cores, the tests apply simultaneously to all thirty core instances, even though automatic test pattern generation ("ATPG") was run on just three core instances in the composite core model. Testing each core type separately would have shown 1000× compression, but testing all three types of cores in parallel gains another factor of 2.1, yielding 2100× compression compared to full scan chip test. Thus, there is a clear benefit to testing different cores in parallel, as opposed to testing them serially, even if it is still possible to create tests for a subset of cores at a time. Benefits include reduced test time and reduced data volume by parallel testing.

There are many other benefits of the disclosed embodiments. First, ATPG may be run against smaller gate-level models, reducing memory and run time. Core out-of-context patterns with compression may be migrated while compressing outputs from multiple cores together. This allows testing of many cores in parallel, subject to other constraints, e.g. power. Second, core pattern migration may be used while still allowing multiple cores to be tested in parallel, producing a more efficient pattern set for the chip. Third, the user of the embodiments can decide whether to run a single core type at a time, or whether to run multiple core types in parallel. If there is an IP core for which a gate-level model is not available, tests for the core can still be migrated, but only multiple instances of that core can be tested in parallel. In general, a composite core model cannot be created without the core internal logic. Fourth, low power testing can be supported by allowing any kind of scheduling of the cores for testing in parallel that is within the constraints of the power budget. For example, all cores could be tested in parallel if low-power ATPG is sufficient to keep power and switching low during test. Gating the clocks to the internal logic may also be supported when the cores are in an EXTEST mode to help reduce power consumption when targeting logic outside the cores. Similarly, when not all cores are active for INTEST migration, the inactive cores can have their clocks gated to avoid consuming power during scan and capture clocking. Fifth and finally, signature-based compression is extended to allow use of internal compares against expected signatures, allowing a direct pass/fail signal for each core for partially bad chips with some core instances allowed to be bad. This can also be useful as an aid to diagnostic processing.

Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A method of testing an integrated circuit having a plurality of logic gates fabricated thereon to determine whether defects are present, wherein the integrated circuit to be tested comprises a plurality of core instances, with each of the plurality of core instances comprising a plurality logic gates, and a plurality of scan chains, the method comprising:
for the plurality of core instances, receiving a plurality of test stimulus values for the plurality of scan chains;
receiving an expected response signature;
broadcasting the expected response signature and mask values to a plurality of identical core instances;
loading the expected response signature and the mask values into the plurality of identical core instances;
loading the plurality of test stimulus values into the plurality of core instances in parallel to produce a test response output for the plurality of core instances;
capturing the test response output for the plurality of core instances into the plurality of scan chains of a corresponding one of the plurality of core instances;
generating a test response signature from the plurality of test response outputs stored in the plurality of scan chains;
comparing the test response signature against the expected response signature;
generating a plurality of pass/fail bits for the plurality of core instances structured to correspond each pass/fail bit of the plurality of pass/fail bits to a core instance of the plurality of core instances, wherein the plurality of pass/fail bits contain information about whether the test response signature matches the expected response signature; and
unloading the pass/fail bits from a pin of the integrated circuit.

2. The method of claim 1, further comprising storing the plurality of pass/fail bits in a plurality of flag registers, wherein the stored pass/fail bits each produce a pass/fail signal.

3. The method of claim 1, wherein the expected response signature and the test response signature comprise composite signatures.

4. The method of claim 3, further comprising merging the composite signatures from the plurality of core instances to create a chip-level composite signature.

5. The method of claim 1, further comprising:
loading mask values of the plurality of core instances; and
masking the test response output for the plurality of core instances using the mask values.

6. The method of claim 1, further comprising concatenating serial load chains across a plurality of non-identical core instances to independently load expected response signatures and masking data, wherein the plurality of non-identical core instances are copies of base core instances of different core types to be tested in parallel.

7. An integrated circuit, comprising:
a plurality of core instances fabricated on the integrated circuit, each of the plurality of core instances having a scan input;
scan test logic of the plurality of core instances, fabricated on the integrated circuit and coupled to the core instance, wherein the scan test logic includes a plurality of logic gates and a plurality of scan chains configured to generate a test response output when the core instance is run with a plurality of test stimulus values;
a test response signature register for the plurality of core instances to store a test response signature generated from the test response output;
an expected response signature register for the plurality of core instances in communication with the scan input to store an expected test response signature, to broadcast the expected test response signature and mask values to a plurality of identical core instances, and to load the expected test response signature and the mask values into the plurality of identical core instances; and
a comparator in the plurality of core instances coupled to the test response signature register and the expected response signature register that compares the test response signature to the expected test response signature, and which outputs a pass/fail signal containing information about whether the test response signature matches the expected response signature for the core instance.

8. The integrated circuit of claim 7, further comprising a flag register for the plurality of core instances to set a pass/fail bit representative of the pass/fail signal.

9. The integrated circuit of claim 7, further comprising:
an output pin; and
a multiplexer configured to select a pass/fail signal from one of the plurality of core instances to feed the pass/fail signal to the output pin through the multiplexer.

10. The integrated circuit of claim 9, further comprising a core pass/fail select bus coupled to the multiplexer to provide a set of core instance select signals to the multiplexer.

11. The integrated circuit of claim 7, wherein the test response signature comprises a composite signature formed by compacting with XOR logic the test response signatures from a plurality of test response signature registers, and wherein the expected response signature comprises a composite signature formed by compacting with XOR logic the expected response signatures from a plurality of expected response signature registers.

12. The integrated circuit of claim 7, further comprising a masking circuit coupled to the scan test logic to mask the test response output of core scan chains according to a plurality of masking values.

13. A computer-readable non-transitory storage medium having stored thereon a plurality of instructions, said plurality of instructions when executed by a computer, cause said computer to perform:
for a plurality of core instances of an integrated circuit to be tested, wherein the plurality of core instances comprise a plurality of logic gates and a plurality of scan chains, receiving a plurality of test stimulus values for the plurality of scan chains;

receiving an expected response signature;

broadcasting the expected response signature and mask values to a plurality of identical core instances;

loading the expected response signature and the mask values into the plurality of identical core instances;

loading the plurality of test stimulus values into the plurality of core instances in parallel to produce a test response output for the plurality of core instances;

capturing the test response output for the plurality of core instances into the plurality of scan chains of a corresponding one of the plurality of core instances;

generating a test response signature from the plurality of test response outputs stored in the plurality of scan chains;

comparing the test response signature against the expected response signature;

generating a plurality of pass/fail bits for the plurality of core instances structured to correspond each pass/fail bit of the plurality of pass/fail bits to a core instance of the plurality of core instances, wherein the plurality of pass/fail bits contain information about whether the test response signature matches the expected response signature; and unloading the pass/fail bits from a pin of the integrated circuit.

14. The computer-readable non-transitory storage medium of claim 13, wherein the plurality of instructions when executed by a computer, cause said computer to further perform storing the plurality of pass/fail bits in a plurality of flag registers, wherein the stored pass/fail bits each produce a pass/fail signal.

15. The computer-readable non-transitory storage medium of claim 13, wherein the expected response signature and the test response signature comprise composite signatures.

16. The computer-readable non-transitory storage medium of claim 15, wherein the plurality of instructions when executed by a computer, cause said computer to further perform merging the composite signatures from the plurality of core instances to create a chip-level composite signature.

17. The computer-readable non-transitory storage medium of claim 13, wherein the plurality of instructions when executed by a computer, cause said computer to further perform:

loading mask values the plurality of core instances; and masking the test response output for the plurality of core instances using the mask values.

18. The computer-readable non-transitory storage medium of claim 13, wherein the plurality of instructions when executed by a computer, cause said computer to further perform concatenating serial load chains across a plurality of non-identical core instances to independently load expected response signatures and masking data, wherein the plurality of non-identical core instances are copies of base core instances of different core type to be tested in parallel.

* * * * *